(12) United States Patent
Wu et al.

(10) Patent No.: US 11,438,201 B2
(45) Date of Patent: Sep. 6, 2022

(54) MILLIMETER WAVE TRANSMITTER

(71) Applicant: RENSSELAER POLYTECHNIC INSTITUTE, Troy, NY (US)

(72) Inventors: Kefei Wu, Portland, OR (US); Mona Mostafa Hella, Watervliet, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 17/259,585

(22) PCT Filed: Jul. 11, 2019

(86) PCT No.: PCT/US2019/041350
§ 371 (c)(1),
(2) Date: Jan. 12, 2021

(87) PCT Pub. No.: WO2020/014444
PCT Pub. Date: Jan. 16, 2020

(65) Prior Publication Data
US 2021/0328841 A1    Oct. 21, 2021

Related U.S. Application Data

(60) Provisional application No. 62/872,453, filed on Jul. 10, 2019, provisional application No. 62/697,187, filed on Jul. 12, 2018.

(51) Int. Cl.
*H04B 1/04* (2006.01)
*H04L 27/20* (2006.01)
(Continued)

(52) U.S. Cl.
CPC .............. *H04L 27/20* (2013.01); *H03F 3/245* (2013.01); *H03K 5/00006* (2013.01); *H04B 1/04* (2013.01);
(Continued)

(58) Field of Classification Search
CPC ..... H03F 3/245; H03F 2200/451; H03K 1/02; H03K 5/00006; H03K 2005/00286;
(Continued)

(56) References Cited

U.S. PATENT DOCUMENTS 7,733,980 B2   6/2010   Beukema et al.
8,089,764 B2   1/2012   Attlesey
(Continued)

OTHER PUBLICATIONS

International Search Report and The Written Opinion of the International Searching Authority, International Application No. PCT/US2019/041350, dated Oct. 9, 2019.

*Primary Examiner* — Shawkat M Ali
(74) *Attorney, Agent, or Firm* — Murtha Cullina LLP; Anthony P. Gangemi

(57) ABSTRACT

A millimeter wave (MMW) circuitry includes a phase modulation circuitry, a plurality of amplifier multiplier chain circuitries and a power combiner circuitry. The phase modulation circuitry is configured to receive input data and a plurality of divided input signals and to provide as output a plurality of phase modulation circuitry output signals. Each phase modulation circuitry output signal corresponds to a respective divided input signal. At least one phase modulation circuitry output signal has a nonzero phase relative to the divided input signals that is related to the input data. Each amplifier multiplier chain circuitry is configured to amplify and frequency multiply and phase multiply the respective phase modulation circuitry output signal to yield a respective power combiner input signal. The power combiner circuitry is configured to sum a plurality of power combiner input signals to yield an output signal. A modulation of the output signal is related to the input data.

18 Claims, 3 Drawing Sheets

(51) Int. Cl.
*H03F 3/24* (2006.01)
*H03K 5/00* (2006.01)

(52) U.S. Cl.
CPC .............. *H03F 2200/451* (2013.01); *H03K 2005/00286* (2013.01); *H04B 2001/0408* (2013.01)

(58) Field of Classification Search
CPC ... H04B 1/04; H04B 1/16; H04B 1/40; H04B 1/56; H04B 1/403; H04B 1/0483; H04B 3/02; H04B 7/00; H04L 5/14; H04L 25/03; H04L 25/49; H04L 27/04; H04L 27/20; H04L 27/34
USPC ............ 333/118; 375/295–297, 308; 455/77, 455/114.3, 127.3, 132, 296
See application file for complete search history.

(56) References Cited

U.S. PATENT DOCUMENTS

| | | |
|---|---|---|
| 8,155,235 B2 | 4/2012 | Fujita et al. |
| 8,385,461 B1 | 2/2013 | Pettus et al. |
| 8,731,007 B2 | 5/2014 | Bar-Sade et al. |
| 9,008,158 B2 | 4/2015 | Kim et al. |
| 9,294,320 B2 | 3/2016 | Shimizu et al. |
| 9,614,552 B2 | 4/2017 | Kim et al. |
| 9,991,751 B2 | 6/2018 | Taghivand et al. |
| 9,998,187 B2 | 6/2018 | Ashraf et al. |
| 2004/0101065 A1* | 5/2004 | Hagh .................... H04L 27/362 375/297 |
| 2007/0206950 A1 | 9/2007 | Liu et al. |
| 2008/0180190 A1 | 7/2008 | Chan et al. |
| 2011/0081872 A1 | 4/2011 | Bar-Sade et al. |
| 2017/0171012 A1 | 6/2017 | Darwish et al. |
| 2017/0338854 A1 | 11/2017 | Perumana et al. |

\* cited by examiner

MILLIMETER WAVE TRANSMITTER

CROSS REFERENCE TO RELATED APPLICATION(S)

This application claims the benefit of U.S. Provisional Application No. 62/697,187, filed Jul. 12, 2018, and U.S. Provisional Application No. 62/872,453, filed Jul. 10, 2019, which are incorporated by reference as if disclosed herein in their entireties.

GOVERNMENT LICENSE RIGHTS

This invention was made with government support under award number IIP-1445042, awarded by the National Science Foundation (NSF), Directorate of Engineering, Division of Industrial Innovation and Partnerships. The government has certain rights in the invention.

FIELD

The present disclosure relates to a transmitter, in particular to, a millimeter wave transmitter.

BACKGROUND

Millimeter wave (MMW) frequencies (e.g., 30 gigahertz (GHz) to 300 GHz) are being explored for ultra high-speed communications with the potential for data rates on the orders of tens or hundreds of gigabits per second (Gbps). Circuit blocks implemented in III-V materials (e.g., InP, GaAs) have demonstrated good performance but at a relatively high cost and a relatively low level of integration. Silicon-based technologies such as CMOS (complementary metal oxide semiconductor) and BiCMOS may have comparable performance in the MMW frequency range as the III-V materials. Silicon is relatively low cost, high yield and has a relatively high level of integration with digital circuits.

Millimeter wave transmitters may be configured to implement a variety of modulation techniques including, but not limited to, on-off keying (OOK), quadrature phase shift keying (QPSK) and quadrature amplitude modulation (QAM). Such modulation techniques typically rely on linear power amplifiers (e.g., OOK, QAM) or utilization of an odd number of harmonics in frequency multiplication (e.g., QPSK). Operating a power amplifier in its linear region and/or utilizing an odd harmonic (i.e., greater than 2) may reduce the corresponding output power for a given input power and thus overall efficiency of the transmitter.

SUMMARY

In some embodiments, there is provided an apparatus. The apparatus includes a millimeter wave (MMW) circuitry. The MMW circuitry includes a phase modulation circuitry, a plurality of amplifier multiplier chain circuitries and a power combiner circuitry. The phase modulation circuitry is configured to receive input data and a plurality of divided input signals. Each divided input signal has an input frequency, $f_{in}$. The phase modulation circuitry is further configured to provide as output a plurality of phase modulation circuitry output signals. Each phase modulation circuitry output signal corresponds to a respective divided input signal. At least one phase modulation circuitry output signal has a nonzero phase relative to the divided input signals. The phase is related to the input data.

Each amplifier multiplier chain circuitry is coupled to a respective output of the phase modulation circuitry and is configured to receive a respective phase modulation circuitry output signal. Each amplifier multiplier chain circuitry includes a power amplifier and a frequency multiplier. Each amplifier multiplier chain circuitry is configured to amplify and frequency multiply and phase multiply the respective phase modulation circuitry output signal to yield a respective power combiner input signal. The power combiner circuitry is configured to sum a plurality of power combiner input signals to yield an output signal. A modulation of the output signal is related to the input data.

In some embodiments of the apparatus, the phase modulation circuitry includes a first phase shifter circuitry, a switch circuitry and a second phase shifter circuitry. The switch circuitry corresponds to a double pole double throw switch that is controlled by the input data and the output signal is an on-off keying modulated signal having a frequency that is double the input frequency, $f_{in}$.

In some embodiments of the apparatus, the power amplifiers are operated in saturation.

In some embodiments of the apparatus, the switch circuitry includes a first switch S1 coupled between a switch circuitry first input and a switch circuitry first output, a second switch S2 coupled between a switch circuitry second input and a switch circuitry second output, a third switch S3 coupled between the switch circuitry first input and the switch circuitry second output, and a fourth switch S4 coupled between the switch circuitry second input and the switch circuitry first output. A state of each switch is selected by the input data.

In some embodiments of the apparatus, the first phase shifter is configured to phase shift a first divided input signal 0° and a second divided input signal 45°. In some embodiments of the apparatus, the second phase shifter is configured to phase shift a first switch circuitry output signal 0° and a second switch circuitry output signal 45°. In some embodiments of the apparatus, the second phase shifter is configured to phase shift a first switch circuitry output signal 45° and a second switch circuitry output signal 0°.

In some embodiments of the apparatus, the phase modulation circuitry includes a first phase shifter circuitry and a second phase shifter circuitry. The first phase shifter circuitry is configured to receive in phase input data and the second phase shifter circuitry is configured to receive quadrature input data. In some embodiments of the apparatus, an output signal modulation corresponds to quadrature phase shift keying (QPSK).

In some embodiments of the apparatus, the MMW circuitry includes a power divider circuitry and two amplifier multiplier chain circuitries. The power divider circuitry is configured to provide two divided input signals to the phase modulation circuitry, and each frequency multiplier is a frequency doubler.

In some embodiments, there is provided a millimeter wave (MMW) transmitter. The MMW transmitter includes an input signal source circuitry and a MMW circuitry. The input signal source circuitry is configured to provide an input signal. The MMW circuitry includes a phase modulation circuitry, a plurality of amplifier multiplier chain circuitries and a power combiner circuitry. The phase modulation circuitry is configured to receive input data and a plurality of divided input signals. Each divided input signal has an input frequency, $f_{in}$. The phase modulation circuitry is further configured to provide as output a plurality of phase modulation circuitry output signals. Each phase modulation circuitry output signal corresponds to a respective divided input signal. At least one phase modulation circuitry output signal has a nonzero phase relative to the divided input signals. The phase is related to the input data.

Each amplifier multiplier chain circuitry is coupled to a respective output of the phase modulation circuitry and is configured to receive a respective phase modulation circuitry output signal. Each amplifier multiplier chain circuitry includes a power amplifier and a frequency multiplier. Each amplifier multiplier chain circuitry is configured to amplify and frequency multiply and phase multiply the respective phase modulation circuitry output signal to yield a respective power combiner input signal. The power combiner circuitry is configured to sum a plurality of power combiner input signals to yield an output signal. A modulation of the output signal is related to the input data.

In some embodiments of the MMW transmitter, the phase modulation circuitry includes a first phase shifter circuitry, a switch circuitry and a second phase shifter circuitry. The switch circuitry corresponds to a double pole double throw switch that is controlled by the input data and the output signal is an on-off keying modulated signal having a frequency that is double the input frequency, In some embodiments of the MMW transmitter, the power amplifiers are operated in saturation.

In some embodiments of the MMW transmitter, the switch circuitry includes a first switch S1 coupled between a switch circuitry first input and a switch circuitry first output, a second switch S2 coupled between a switch circuitry second input and a switch circuitry second output, a third switch S3 coupled between the switch circuitry first input and the switch circuitry second output, and a fourth switch S4 coupled between the switch circuitry second input and the switch circuitry first output. A state of each switch is selected by the input data.

In some embodiments of the MMW transmitter, the first phase shifter is configured to phase shift a first divided input signal 0° and a second divided input signal 45°. In some embodiments of the MMW transmitter, the second phase shifter is configured to phase shift a first switch circuitry output signal 0° and a second switch circuitry output signal 45°. In some embodiments of the MMW transmitter, the second phase shifter is configured to phase shift a first switch circuitry output signal 45° and a second switch circuitry output signal 0°.

In some embodiments of the MMW transmitter, the phase modulation circuitry includes a first phase shifter circuitry and a second phase shifter circuitry. The first phase shifter circuitry is configured to receive in phase input data and the second phase shifter circuitry is configured to receive quadrature input data. In some embodiments of the MMW transmitter, an output signal modulation corresponds to quadrature phase shift keying (QPSK).

In some embodiments of the MMW transmitter, the MMW circuitry includes a power divider circuitry and two amplifier multiplier chain circuitries. The power divider circuitry is configured to provide two divided input signals to the phase modulation circuitry, and each frequency multiplier is a frequency doubler.

BRIEF DESCRIPTION OF THE DRAWINGS

The drawings show embodiments of the disclosed subject matter for the purpose of illustrating features and advantages of the disclosed subject matter. However, it should be understood that the present application is not limited to the precise arrangements and instrumentalities shown in the drawings, wherein.

DETAILED DESCRIPTION

Generally, this disclosure relates to a millimeter wave (MMW) transmitter configured to generate relatively complex MMW waveforms at relatively high efficiency. An apparatus, method and/or system are configured to receive an input signal (with frequency, $f_{in}$) related to a carrier signal and digital input data that is to be transmitted by the MMW transmitter. The apparatus, method and/or system are configured to divide the input signal into a plurality of divided input signals and to provide each divided input signal to a respective path. Each path includes phase modulation circuitry and a respective amplifier multiplier chain circuitry. Each amplifier multiplier chain circuitry includes a power amplifier and a frequency multiplier circuitry. In each path, the divided input signal may be phase modulated prior to the respective amplifier multiplier chain. The phase modulation is driven by digital data that is to be transmitted. Modulation techniques may include, but are not limited to, on-off keying (OOK), quadrature phase shift keying (QPSK), quadrature amplitude modulation (QAM), etc. Each phase modulated divided input signal may then be amplified and frequency (and phase) multiplied by the respective amplifier multiplier chain circuitry. The output signals from each path may then have a frequency that is a multiple of the frequency, $f_{in}$, of the input signal. The output signals from each path may then be combined to yield an output signal that is then transmitted. Thus, a modulation of the transmitted output signal may be implemented by the MMW circuitry and the carrier frequency of the transmitted output signal may then be a multiple of $f_{in}$.

For example, each power amplifier included in an MMW transmitter configured to implement OOK modulation may be operated in saturation, enabling relatively high output power and relatively high efficiency. In another example, a second harmonic may be extracted from each frequency multiplier, e.g., frequency doubler, included in a transmitter configured to implement QPSK modulation, thus achieving higher output power compared to a higher (e.g., third) harmonic.

Figure 1:
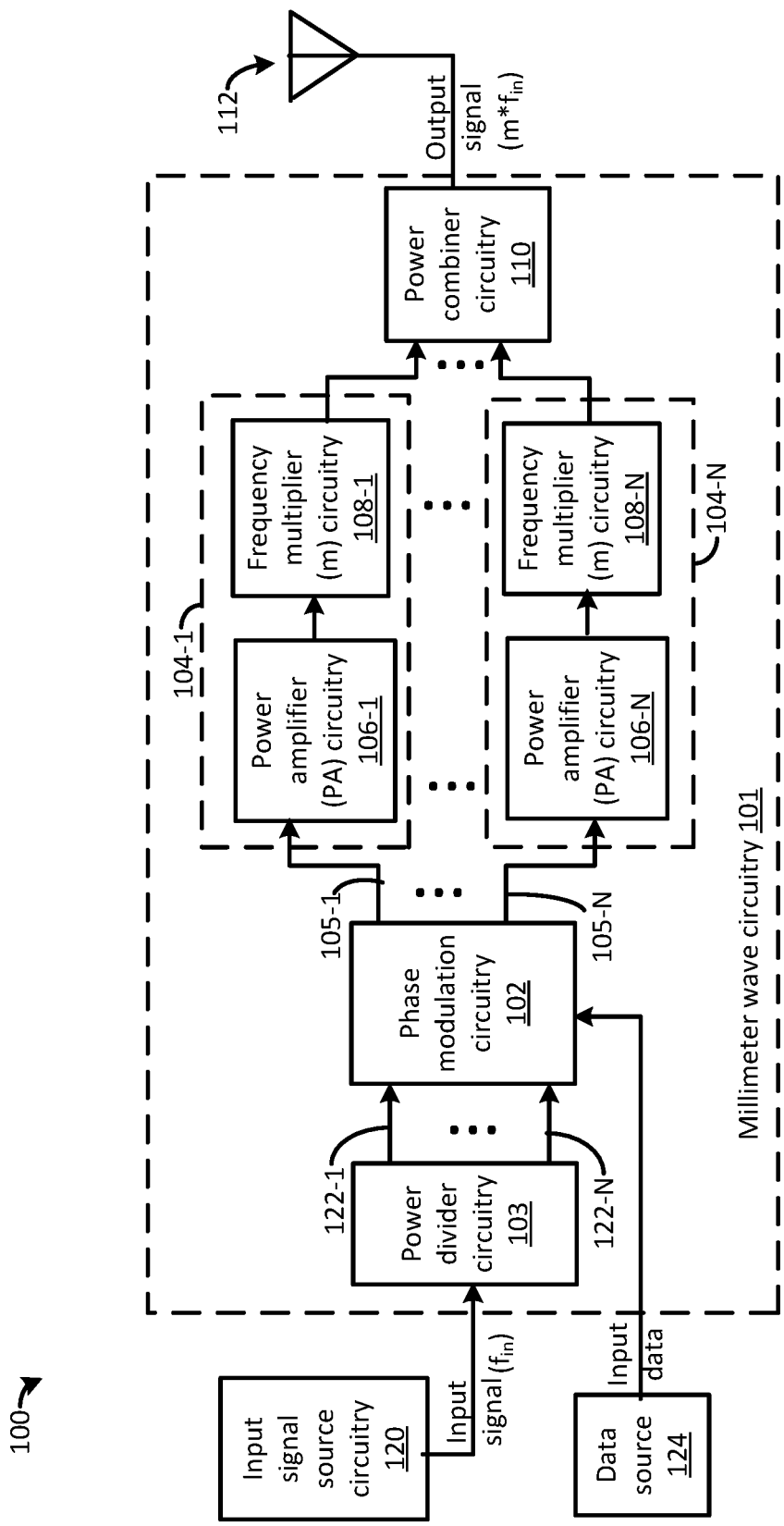
FIG. 1 illustrates a functional block diagram of a transmitter including millimeter wave (MMW) circuitry according to several embodiments of the present disclosure.

FIG. 1 illustrates a functional block diagram of a transmitter 100 including millimeter wave (MMW) circuitry 101 according to several embodiments of the present disclosure. Transmitter 100 may be configured to transmit signals in the MMW range, e.g., carrier frequency of 30-300 GHz, modulated with digital data. The carrier frequency of the output signal may correspond to a multiple of the frequency of the input signal, as will be described in more detail below. Transmitter 100 further includes antenna 112, input signal source circuitry 120 and a data source 124. Input signal source circuitry 120 may include, for example, an oscillator. Input signal source circuitry 120 may thus be configured to generate an input signal with wavelengths on the order of millimeters and frequencies ($f_{in}$) on the orders of tens to hundreds of gigahertz. Data source 124 may be configured to generate and/or provide digital data for modulation by millimeter wave circuitry 101 and transmission via antenna 112.

Millimeter wave circuitry 101 includes power divider circuitry 103, phase modulation circuitry 102, a plurality of amplifier multiplier chain circuitries 104-1, ..., 104-N and power combiner circuitry 110. In one nonlimiting example, millimeter wave circuitry 101 may include two amplifier multiplier chain circuitries. Each amplifier multiplier chain circuitry 104-1, ..., 104-N includes a respective power amplifier circuitry 106-1, ..., 106-N and a corresponding frequency multiplier circuitry 108-1, ..., 108-N. For example, amplifier multiplier chain circuitry 104-1 includes power amplifier circuitry 106-1 and corresponding frequency multiplier circuitry 108-1.

Power divider circuitry 103 is configured to receive the input signal from input signal source circuitry 120. Power divider circuitry 103 is further configured to divide (i.e., split) the input signal into a plurality of corresponding divided input signals and to provide each divided input signal to a respective phase modulation circuitry input node 122-1, ... 122-N. Each divided input signal is configured to have a same frequency, $f_{in}$, as the input signal received from input signal source circuitry 120. In one nonlimiting example, power divider circuitry 103 may correspond to a Wilkinson power divider. However, this disclosure is not limited in this regard. Thus, a plurality of divided input signals with frequency, $f_{in}$, may be provided to phase modulation circuitry 102.

Phase modulation circuitry 102 is configured to receive the plurality of divided input signals from power divider circuitry 103 and is further configured to receive input data from data source 124. The input data from data source 124 corresponds to data to be transmitted by transmitter 100. In one nonlimiting example, the input data may correspond to digital data that includes a stream of data bits with possible values logic 1 or logic 0, thus each transmitted symbol corresponds to one bit. In another nonlimiting example, the input data may include two bit streams with one bit stream corresponding to in phase data bits and another bit stream corresponding to quadrature data bits, thus each transmitted symbol may correspond to two bits. Phase modulation circuitry 102 is configured to modulate (e.g., shift) the phase of each divided input signal based, at least in part, on the input data to yield a plurality of phase modulation circuitry output signals. Each of the plurality of phase modulation circuitry output signals may be provided to a respective phase modulation circuitry output node of the plurality of phase modulation circuitry output nodes 105-1, ..., 105-N, and thus to a corresponding respective amplifier multiplier chain circuitry of the plurality of amplifier multiplier chain circuitries 104-1, ..., 104-N.

Each power amplifier circuitry, e.g., power amplifier circuitry 106-1, is configured to amplify the respective phase modulation circuitry output signal and to provide the amplified phase modulation circuitry output signal to the corresponding respective frequency multiplier circuitry, e.g., frequency multiplier circuitry 108-1. Each frequency multiplier circuitry, e.g., frequency multiplier circuitry 108-1, is configured to multiply the frequency (and phase) of the amplified phase modulation circuitry output signal to yield a respective amplifier multiplier chain output signal and to provide the respective amplifier multiplier chain output signal to power combiner circuitry 110. The frequency of the amplified phase modulation circuitry output signal corresponds to the frequency $f_{in}$ of the input signal while the frequency of the amplifier multiplier chain output signal corresponds to a whole number multiple, m, of $f_{in}$, i.e., $m*f_{in}$. In one nonlimiting example, m may be equal to 2. In this example, each frequency multiplier circuitry, e.g., frequency multiplier circuitry 108-1, may then correspond to a frequency doubler. Power combiner circuitry 110 is configured to combine the amplifier multiplier chain output signals from each frequency multiplier circuitry 108-1, ..., 108-N to yield an output signal. The output signal may then correspond to a modulated carrier with frequency $m*f_{in}$ with phase modulation implemented by millimeter wave circuitry 101. The output signal may then be transmitted via antenna 112.

The architecture of millimeter wave circuitry 101, e.g., dividing the input signal into a plurality of paths and implementing phase modulation prior to amplification and frequency multiplication for each path, is configured to facilitate achieving relatively high output power and relatively lower conversion loss in the amplifier multiplier chains. For example, for OOK modulation, the architecture of millimeter wave circuitry 101 is configured to allow use of a nonlinear power amplifier 106-1, e.g., a power amplifier operating in saturation. In another example, for QPSK modulation, the architecture of millimeter wave circuitry 101 is configured to allow extraction of an even harmonic, e.g., a second harmonic. In other words, the architecture of millimeter wave circuitry 101 is configured to preserve the quadrature phase shift keying constellation while utilizing the second harmonic. It may be appreciated that the second harmonic may have a higher amplitude than a higher odd harmonic, e.g., third harmonic.

Figure 2:
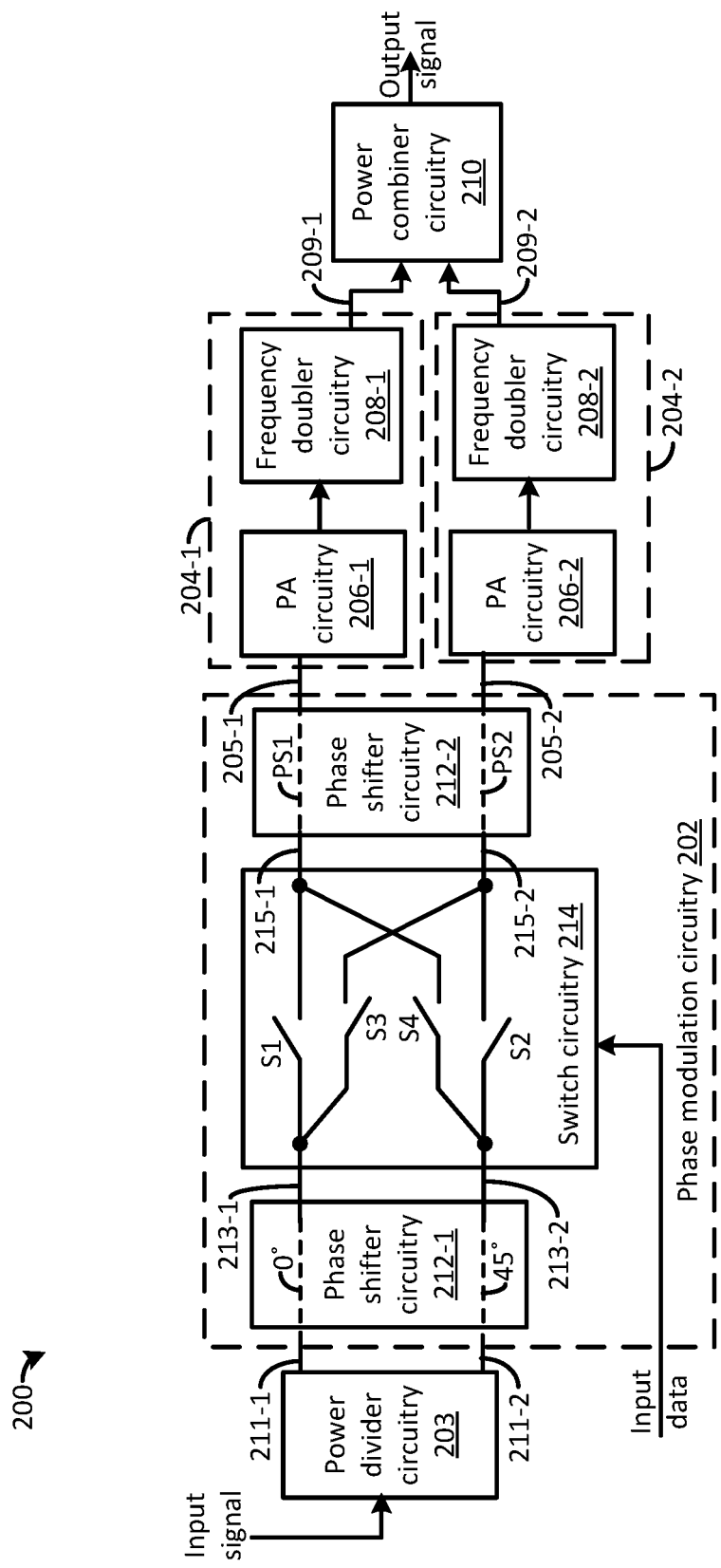
FIG. 2 illustrates a functional block diagram of one example MMW circuitry configured for on-off keying (OOK) modulation.

FIG. 2 illustrates a functional block diagram of one example MMW circuitry 200 configured for on-off keying (OOK) modulation. MMW circuitry 200 includes power divider circuitry 203, phase modulation circuitry 202, amplifier multiplier chain circuitries 204-1, 204-2 and power combiner circuitry 210. Phase modulation circuitry 202 is one example of phase modulation circuitry 102 of FIG. 1. A first amplifier multiplier chain circuitry 204-1 includes a first power amplifier circuitry 206-1 and a first frequency doubler circuitry 208-1. A second amplifier multiplier chain circuitry 204-2 includes a second power amplifier circuitry 206-2 and a second frequency doubler circuitry 208-2. Amplifier multiplier chain circuitries 204-1, 204-2 correspond to amplifier multiplier chain circuitries 104-1, ..., 104-N, of FIG. 1 with N equal to 2. Frequency doubler circuitries 208-1, 208-2 correspond to the frequency multiplier circuitries 108-1, ..., 108-N of FIG. 1, with m equal to 2.

Power divider circuitry 203 is configured to receive an input signal with frequency $f_{in}$ and to divide the input signal into two divided input signals. The two divided input signals may be provided to phase modulation circuitry input nodes 211-1, 211-2. Each input signal has frequency $f_{in}$. In one nonlimiting example, power divider circuitry 203 may correspond to a Wilkinson power divider.

Phase modulation circuitry 202 is configured to receive the divided input signals and to provide a plurality of phase modulated output signals at phase modulation circuitry output nodes 205-1, 205-2. An amount of phase modulation is based, at least in part, on a value of an input data bit. For example, input data received by phase modulation circuitry 202 may include a plurality of data bits. The phase modulated output signals correspond to phase modulated divided input signals.

Phase modulation circuitry 202 includes a first phase shifter circuitry 212-1, a second phase shifter circuitry 212-2 and a switch circuitry 214. Phase modulation circuitry 202 is configured to facilitate relatively fast and accurate switching between 0° and 90° and/or between 0° and 45°. In other words, the phase shifters 212-1, 212-2 are configured as two constant 45° phase shifters. The phase shifters 212-1, 212-2 are coupled by the switch circuitry 214 corresponding to a double pole double throw (DPDT) switch. A state of each switch (i.e., whether the switch is on or off) in switch circuitry 214 depends on (i.e., is selected by) the input data, i.e., whether each data bit corresponds to a zero or a one. In one nonlimiting example, the phase shifter circuitries 212-1, 212-2 may be implemented as passive inductor and capacitor circuits. Implementing the phase shifter circuitries 212-1, 212-2 as passive inductor and capacitor circuits may then correspond to an optimization for relatively wide bandwidth and relatively accurate phase angle.

The first phase shifter circuitry 212-1 is configured to receive a first and a second divided input signal at a first and a second phase modulation circuitry input node 211-1, 211-2, respectively. The first phase shifter circuitry 212-1 is configured to phase shift the first divided input signal by 0° to yield a first switch circuitry input signal at first switch circuitry input node 213-1. The first phase shifter circuitry 212-1 is further configured to phase shift the second divided input signal by 45° to yield a second switch circuitry input signal at a second switch circuitry input node 213-2. The switch circuitry input nodes 213-1, 213-2 correspond to the poles of switch circuitry 202.

The switch circuitry 214 is further configured to receive input data and to modulate the phase of the divided input signals based, at least in part, on the input data. The switch circuitry 214 is configured to provide a first switch circuitry output signal at a first switch circuitry output node 215-1 and a second switch circuitry output signal at a second switch circuitry output node 215-2. The second phase shifter circuitry 212-2, coupled to the switch circuitry 202 at nodes 215-1, 215-2, is configured to receive the switch circuitry output signals.

The second phase shifter circuitry 212-2 is configured to phase shift the first switch circuitry output signal by PS1 to yield a first phase modulation circuitry output signal. The first phase modulation circuitry output signal may be provided to a first phase modulation circuitry output node 205-1. The second phase shifter circuitry 212-2 is further configured to phase shift the second switch circuitry output signal by PS2 to yield a second phase modulation circuitry output signal. The second phase modulation circuitry output signal may be provided to a second phase modulation circuitry output node 205-2. In one nonlimiting example, PS1 is equal to 0° and PS2 is equal to 45°. In another nonlimiting example, PS1 is equal to 45° and PS2 is equal to 0°. Each phase modulation circuitry output signal may then be provided to a respective amplifier multiplier chain circuitry 204-1, 204-2. Each amplifier multiplier chain circuitry 204-1, 204-2 is configured to provide a respective power combiner input signal at a respective power combiner input node 209-1, 209-2. It may be appreciated that each power combiner input signal may have an associated phase angle that is twice (i.e., double) a respective phase angle of the corresponding phase modulation circuitry output signal.

In an embodiment, switch circuitry 214 is a double pole double throw switch assembly. For ease of illustration, switch circuitry 214 is drawn as a plurality of single pole single throw switches S1, S2, S3, S4. Switch S1 is coupled between the first switch circuitry input node 213-1 and the first switch circuitry output node 215-1. Switch S2 is coupled between the second switch circuitry input node 213-2 and the second switch circuitry output node 215-2. Switch S3 is coupled between the first switch circuitry input 213-1 node and the second switch circuitry output node 215-2. Switch S4 is coupled between the second switch circuitry input node 213-2 and the first switch circuitry output node 215-1.

During operation, respective states of switches S1, S2, S3, S4 depend on (i.e., are selected by) the input data. Respective phase angles of each power combiner input signal may then be based, at least in part, on the respective switch states and thus on the input data. For example, if the input data corresponds to a logic 0, switches S1 and S2 are configured to be open (i.e., off) and switches S3 and S4 are configured to be closed (i.e., on). Conversely, if the input data corresponds to a logic 1, switches S1 and S2 are configured to be closed (i.e., on) and switches S3 and S4 are configured to be open (i.e., off). Operation of switch circuitry 214 may be illustrated by Example 1 and Example 2.

Example 1

In a first example, PS1 is 0° and PS2 is 45°. When the input data bit corresponds to a logic 1, switches S1 and S2 are on (i.e., closed) and switches S3 and S4 are off (i.e., open). The first phase modulation output node 205-1 may then be coupled to the first switch circuitry input node 213-1 by switch S1. Similarly, the second phase modulation output node 205-2 may then be coupled to the second switch circuitry input node 213-2 by switch S2. A phase shift of the first phase modulation circuitry output signal may then be 0° corresponding to a sum of the phase shifts of the first and second phase shifter circuitries along a first path that includes nodes 211-1, 213-1, 215-1 and 205-1, i.e., 0°+0°. A phase shift of the second phase modulation circuitry output signal may then be 90° corresponding to a sum of the phase shifts of the first and second phase shifter circuitries along a second path that includes nodes 211-2, 213-2, 215-2 and 205-2, i.e., 45°+45°.

When the input data bit corresponds to logic 0, switches S1 and S2 are off and switches S3 and S4 are on. The first phase modulation output node 205-1 may then be coupled to the second switch circuitry input node 213-2 by switch S4. Similarly, the second phase modulation output node 205-2 may then be coupled to the first switch circuitry input node 213-1 by switch S3. A phase shift of the first phase modulation circuitry output signal may then be 45° corresponding to a sum of the phase shifts of the first and second phase shift circuitries along a path that includes nodes 211-2, 213-2, 215-1 and 205-1, i.e., 45°+0°. A phase shift of the second phase modulation circuitry output signal may then be 45° corresponding to a sum of the phase shifts of the first and second phase shift circuitries along a path that includes nodes 211-1, 213-1, 215-2 and 205-2, i.e., 0°+45°.

Thus, when the data bit corresponds to logic 1, the phase angle of the first phase modulation circuitry output signal at node 205-1 is 0° and the phase angle of the second phase modulation circuitry output signal at node 205-2 is 90° (relative to the input signal). Conversely, when the data bit corresponds to logic 0 the phase angle of the first phase modulation circuitry output signal at node 205-1 and the phase angle of the second phase modulation circuitry output signal at node 205-2 are both 45° (relative to the input signal). In operation, the first and second phase modulation circuitry output signals may be amplified, their frequency doubled and their respective phase shifts doubled between nodes 205-1 and 209-1 and nodes 205-2 and 209-2, respectively, by the respective amplifier multiplier chains 204-1, 204-2.

Thus, the first power combiner input signal at node 209-1 is configured to have a frequency of twice the frequency of the input signal (i.e. 2*$f_{in}$) and a phase relative to the input signal of twice the phase of the first phase modulation circuitry output signal. Similarly, the second power combiner input signal at node 209-2 is configured to have a frequency of twice the frequency of the input signal and a phase relative to the input signal of twice the phase of the second phase modulation circuitry output signal. Thus, when the data bit corresponds to a logic 1, the first power combiner input signal has phase angle of 0° (i.e., 2*0°=0°) and the second power combiner input signal has phase angle 180° (i.e., 2*90°=180°). Thus, the output signal generated by power combiner circuitry 210 may then correspond to carrier not present since the sum of two signals of a same amplitude and a respective frequency 180° out of phase is zero (to within a tolerance of circuitry and/or noise considerations).

When the data bit corresponds to logic 0, the first power combiner input signal has a phase relative to the input signal of 90° (i.e., 2*45°=90°) and the second power combiner input signal as a phase relative to the input signal of 90° (i.e., 2*45°=90°). Thus, the output signal generated by power combiner circuitry 210 may then correspond to carrier present at twice the amplitude of the outputs of power amplifier circuitries 206-1, 206-2, phase of 90° and frequency of 2*$f_{in}$ (to within tolerances of the circuitries and noise considerations).

Example 2

In a second example, PS1 is 45° and PS2 is 0°. When the input data bit corresponds to a logic 1, switches S1 and S2 are on (i.e., closed) and switches S3 and S4 are off (i.e., open). By a similar analysis as Example 1, as described herein, when the input data bit corresponds to a logic 1, a phase shift of the first phase modulation circuitry output signal may be 45° and a phase shift of the second phase modulation circuitry output signal may be 45°. The respective phases of the power combiner input signals may both be 90°. The output signal may then correspond to carrier present for input data bit of logic 1 since the combiner circuitry input signals are in phase.

Continuing with this second example, when the input data bit corresponds to logic 0, switches S1 and S2 are off and switches S3 and S4 are on. By a similar analysis as Example 1, as described herein, when the input data bit corresponds to logic 0, a phase shift of the first phase modulation circuitry output signal may be 90° and a phase shift of the second phase modulation circuitry output signal may be 0°. The respective phases of the power combiner input signals may then be 180° and 0°. The output signal may then correspond to carrier not present for input data bit equal to logic 0 since the combiner circuitry input signals are 180° out of phase.

Thus, example MMW circuitry 200 is configured to receive an input signal with frequency $f_{in}$ and is further configured to receive input data that includes a plurality of data bits (i.e., data stream). Power divider circuitry 203 is configured to split the input signal into two divided signals of frequency $f_{in}$. Phase modulation circuitry 202 includes two phase shifter circuitries 212-1, 212-2 and switch circuitry 214. Switch circuitry 214 corresponds to a double pole double throw switch that is controlled by the input data stream. Phase modulation circuitry 202 is thus configured to phase shift (i.e., modulate) each of the two divided input signals based, at least in part, on the input data. Each amplifier multiplier chain 204-1, 204-2 is configured to amplify respective phase modulation circuitry outputs and to double the frequency and respective phase shifts to yield the first and second power combiner input signals at nodes 209-1 209-2. The output signal from the power combiner circuitry 210, corresponding to a sum of the power combiner input signals, may then correspond to carrier present (on)/carrier not present (off) keying.

Modulating the divided input signals prior to providing the corresponding signals to the amplifier multiplier chains allows nonlinear operation (e.g., operation in saturation) of the power amplifier circuitry. Thus, the amplifier frequency doubler chain may operate in a relatively deep nonlinearity for relatively higher output power and efficiency and at a higher frequency.

Figure 3:
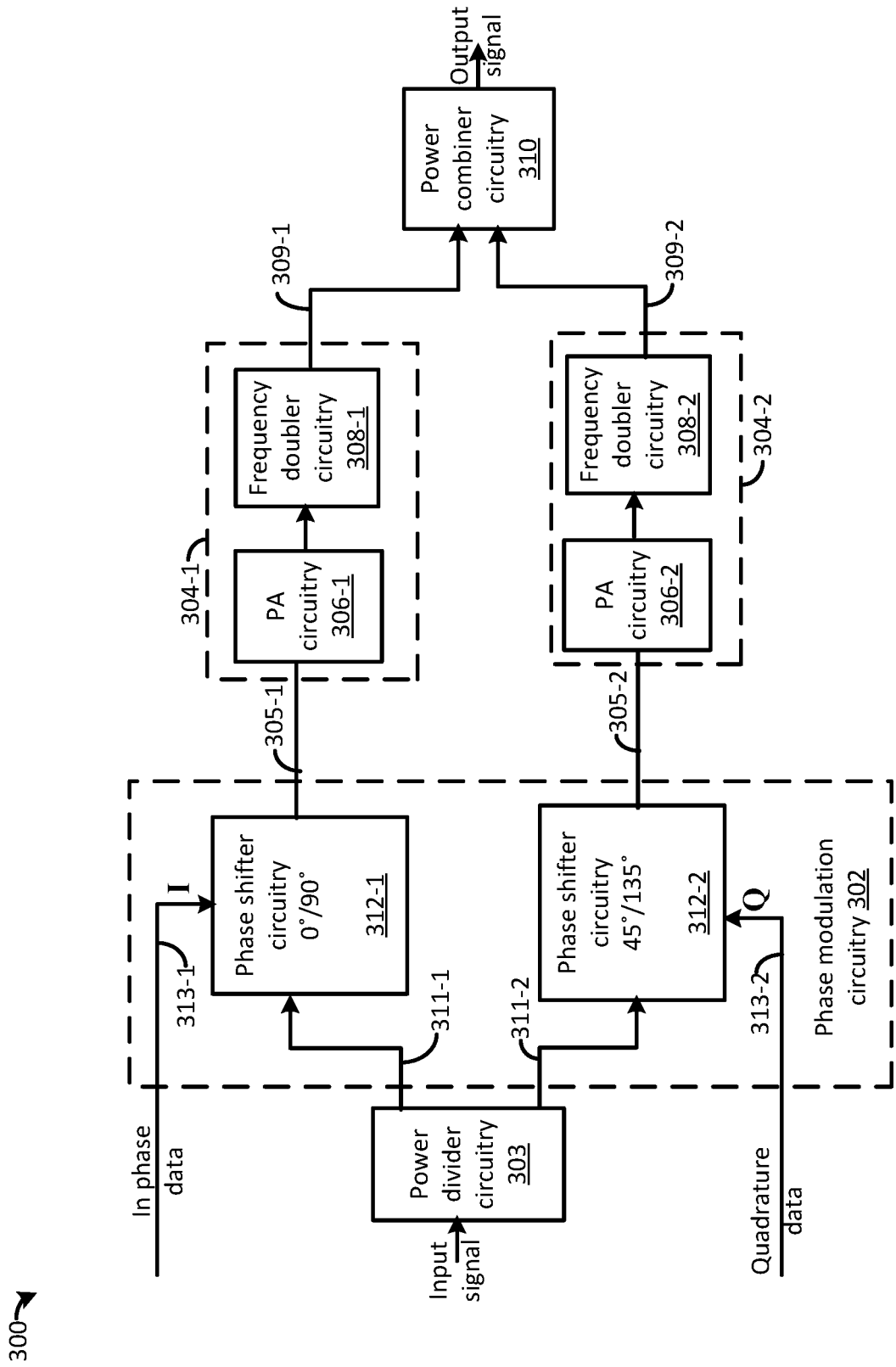
FIG. 3 illustrates a functional block diagram of another example MMW circuitry configured for quadrature phase shift keying (QPSK) modulation.

FIG. 3 illustrates a functional block diagram of another example MMW circuitry 300 configured for quadrature phase shift keying (QPSK) modulation. MMW circuitry 300 includes power divider circuitry 303, phase modulation circuitry 302, amplifier multiplier chains 304-1 and 304-2 and power combiner circuitry 310. Phase modulation circuitry 302 is one example of phase modulation circuitry 102 of FIG. 1. A first (e.g., in phase) amplifier multiplier chain circuitry 304-1 includes a first power amplifier circuitry 306-1 and a first frequency doubler circuitry 308-1. A second (e.g., quadrature) amplifier multiplier chain circuitry 304-2 includes a second power amplifier circuitry 306-2 and a second frequency doubler circuitry 308-2. Amplifier multiplier chain circuitries 304-1, 304-2 correspond to amplifier multiplier chain circuitries 104-1, . . . , 104-N, of FIG. 1 with N equal to 2. Frequency doubler circuitries 308-1, 308-2 correspond to the frequency multiplier circuitries 108-1, . . . , 108-N of FIG. 1, with m=2.

Power divider circuitry 303 is configured to receive an input signal with frequency $f_{in}$, to divide the input signal into two divided input signals and to provide the divided input signals to phase modulation circuitry 302 via phase modulation circuitry input nodes 311-1, 311-2. Phase modulation circuitry 302 is further configured to receive an in phase data stream (I) and a quadrature data stream (Q). Each symbol in QPSK may correspond to a pair of data bits. A first bit in the pair of data bits may be included in in phase data and a second bit in the pair of data bits may be included in quadrature data.

Phase modulation circuitry 302 includes a first phase shifter circuitry 312-1 and a second phase shifter circuitry 312-2. The first phase shifter circuitry 312-1 is configured to receive the in phase data signal at node 313-1. The second phase shifter circuitry 312-2 is configured to receive the quadrature data signal at node 313-2.

The first phase shifter circuitry 312-1 is configured to provide a first phase shifted output signal at first phase modulation circuitry output node 305-1. The second phase shifter circuitry 312-2 is configured to provide a second phase shifted output signal at second phase modulation circuitry output node 305-2. The phase shift provided by the first phase shifter circuitry 312-1 is configured to be 0° or 90° based, at least in part, on whether the in phase data bit is equal to a logic 0 or a logic 1. The phase shift provided by the second phase shifter circuitry 312-2 is configured to be 45° or 135° based, at least in part, on whether the quadrature data bit is equal to logic 0 or logic 1. Thus, the first (i.e., in phase) phase modulation circuitry output signal may have a phase angle relative to the input signal of 0° or 90° based, at least in part, on the in phase data bit. Similarly, the second (i.e., quadrature) phase modulation circuitry output signal may have a phase angle relative to the input signal of 45° or 135° based, at least in part, on the quadrature data bit The phase shifted output signals (i.e., in phase and quadrature) that are output from phase modulation circuitry 302 may then be amplified by respective power amplifier circuitries 306-1, 306-2 and frequency doubled and phase doubled by respective frequency doubler circuitries 308-1, 308-2. Respective amplified and frequency doubled in phase and quadrature signals may then be provided to power combiner circuitry input nodes 309-1, 309-2. For example, the phase shift of the in phase output signal from phase modulation circuitry 302 may be doubled by first frequency doubler circuitry 308-1 to yield in phase power combiner input signal at node 309-1. The in phase power combiner input signal may be phase shifted from the input signal by 0° or 180°. In another example, the phase shift of the quadrature output signal from modulation circuitry 302 may be doubled by a second frequency doubler circuitry 308-2 to yield quadrature power combiner input signal at node 309-2. The quadrature power combiner input signal may be phase shifted from the input signal by 90° or 270°.

Power combiner circuitry 310 is configured to combine the in phase power combiner input signal and the quadrature power combiner input signal and to provide the combined signal as output (output signal). Thus, the output signal modulation may correspond to QPSK. It may be appreciated that the QPSK constellation is formed after the frequency doubler circuitries 308-1, 308-2, thus the QPSK constellation is preserved even if a second harmonic is used. Utilizing the second harmonic is configured to yield a relatively higher output power compared to using, for example, the third harmonic.

It is contemplated that a MMW transmitter with a MMW circuitry that includes phase modulation prior to amplification and frequency multiplication (e.g., doubling) may be configured to implement higher order modulation schemes including, but not limited to, 8—PSK, 16—QAM, etc., consistent with the present disclosure.

Thus, a MMW transmitter may be configured to generate relatively complex MMW waveforms at relatively high efficiency. An apparatus, method and/or system are configured to receive an input signal (with frequency, $f_{in}$) related to a carrier signal and digital input data that is to be transmitted by the MMW transmitter. The apparatus, method and/or system are configured to divide the input signal into a plurality of divided input signals and to provide each divided input signal to a respective path. Each path includes phase modulation circuitry and a respective amplifier multiplier chain circuitry. Each amplifier multiplier chain circuitry includes a power amplifier and a frequency multiplier circuitry. In each path, the divided input signal may be phase modulated prior to the respective amplifier multiplier chain. The phase modulation is driven by digital data that is to be transmitted. Modulation techniques may include, but are not limited to, on-off keying (OOK), quadrature phase shift keying (QPSK), quadrature amplitude modulation (QAM), etc. Each phase modulated divided input signal may then be amplified and frequency (and phase) multiplied by the respective amplifier multiplier chain circuitry. The output signals from each path may then have a frequency that is a multiple of the frequency, $f_{in}$, of the input signal. The output signals from each path may then be combined to yield an output signal that is then transmitted. The carrier frequency of the output signal may then be a multiple of $f_{in}$.

For example, each power amplifier included in an MMW transmitter configured to implement OOK modulation may be operated in saturation, enabling relatively high output power and relatively high efficiency. In another example, a second harmonic may be extracted from each frequency multiplier, e.g., frequency doubler, included in a transmitter configured to implement QPSK modulation, thus achieving higher output power compared to a higher (e.g., third) harmonic.

"Circuitry", as used in any embodiment herein, may include, for example, singly or in any combination, hard-wired circuitry, programmable circuitry such as computer processors including one or more individual instruction processing cores, state machine circuitry, and/or firmware that stores instructions executed by programmable circuitry. The logic may, collectively or individually, be embodied as circuitry that forms part of a larger system, for example, an integrated circuit (IC), an application-specific integrated circuit (ASIC), a field-programmable gate array (FPGA), a programmable logic device (PLD), a complex programmable logic device (CPLD), a system on-chip (SoC), etc.

What is claimed is:

1. An apparatus comprising:
a millimeter wave (MMW) circuitry comprising:
a phase modulation circuitry configured to receive input data and a plurality of divided input signals, each divided input signal having an input frequency, $f_{in}$, the phase modulation circuitry further configured to provide as output a plurality of phase modulation circuitry output signals, each phase modulation circuitry output signal corresponding to a respective divided input signal, at least one phase modulation circuitry output signal having a nonzero phase relative to the divided input signals, the nonzero phase related to the input data;
a plurality of amplifier multiplier chain circuitries, each amplifier multiplier chain circuitry coupled to a respective output of the phase modulation circuitry and configured to receive a respective phase modulation circuitry output signal, each amplifier multiplier chain circuitry comprising a power amplifier and a frequency multiplier, each amplifier multiplier chain circuitry configured to amplify, frequency multiply and phase multiply the respective phase modulation circuitry output signal to yield a respective power combiner input signal; and
a power combiner circuitry configured to sum a plurality of power combiner input signals to yield an output signal, a modulation of the output signal related to the input data;
wherein the phase modulation circuitry comprises a first phase shifter circuitry, a switch circuitry and a second phase shifter circuitry, the switch circuitry corresponding to a double pole double throw switch that is controlled by the input data and the output signal is an on-off keying modulated signal having a frequency that is double the input frequency, $f_{in}$.

2. The apparatus of claim 1, wherein the power amplifiers are operated in saturation.

3. The apparatus of claim 1, wherein the switch circuitry comprises a first switch S1 coupled between a switch circuitry first input and a switch circuitry first output, a second switch S2 coupled between a switch circuitry second input and a switch circuitry second output, a third switch S3 coupled between the switch circuitry first input and the switch circuitry second output, and a fourth switch S4 coupled between the switch circuitry second input and the switch circuitry first output, a state of each switch selected by the input data.

4. The apparatus of claim 1, wherein the first phase shifter is configured to phase shift a first divided input signal 0° and a second switch circuitry output signal 45°.

5. The apparatus of claim 4, wherein the second phase shifter is configured to phase shift a first switch circuitry output signal 0° and a second switch circuitry output signal 45°.

6. The apparatus of claim 4, wherein the second phase shifter is configured to phase shift a first switch circuitry output signal 45° and a second switch circuitry output signal 0°.

7. The apparatus of claim 1, wherein the first phase shifter circuitry is configured to receive in-phase (I) input data and the second phase shifter circuitry is configured to receive quadrature (Q) input data.

8. The apparatus of claim 7, wherein an output signal modulation corresponds to quadrature phase shift keying (QPSK).

9. The method of claim 1, wherein the MMW circuitry comprises a power divided circuitry and two amplifier multiplier chain circuitries, the power divider circuitry configured to provide two divided input signals to the phase modulation circuitry, and each frequency multiplier is a frequency doubler.

10. A millimeter wave (MMW) transmitter, the MMW transmitter comprising:
an input signal source circuitry configured to provide an input signal; and
a MMW circuitry comprising:
a phase modulation circuitry configured to receive input data and a plurality of divided input signals, each divided input signal having an input frequency, $f_{in}$, the phase modulation circuitry further configured to provide as output a plurality of phase modulation circuitry output signals, each phase modulation circuitry output signal corresponding to a respective divided input signal, at least one phase modulation circuitry output signal having a nonzero phase relative to the divided input signals, the nonzero phase related to the input data;
a plurality of amplifier multiplier chain circuitries, each amplifier multiplier chain circuitry coupled to a respective output of the phase modulation circuitry and configured to receive a respective phase modulation circuitry output signal, each amplifier multiplier chain circuitry comprising a power amplifier and a frequency multiplier, each amplifier multiplier chain circuitry configured to amplify, frequency multiply and phase multiply the respective phase modulation circuitry output signal to yield a respective power combiner input signal; and
a power combiner circuitry configured to sum a plurality of power combiner input signals to yield an output signal, a modulation of the output signal related to the input data;
wherein the phase modulation circuitry comprises a first phase shifter circuitry, a switch circuitry and a second phase shifter circuitry, the switch circuitry corresponding to a double pole double throw switch that is controlled by the input data and the output signal is an on-off keying modulated signal having a frequency that is double the input frequency, $f_{in}$.

11. The MMW transmitter of claim 10, wherein the power amplifiers are operated in saturation.

12. The MMW transmitter of claim 10, wherein the switch circuitry comprises a first switch S1 coupled between a switch circuitry first input and a switch circuitry first output, a second switch S2 coupled between a switch circuitry second input and a switch circuitry second output, a third switch S3 coupled between the switch circuitry first input and the switch circuitry second output, and a fourth switch S4 coupled between the switch circuitry second input and the switch circuitry first output, a state of each switch selected by the input data.

13. The MMW transmitter of claim 10, wherein the first phase shifter is configured to phase shift a first divided input signal 0° and a second switch circuitry output signal 45°.

14. The MMW transmitter of claim 13, wherein the second phase shifter is configured to phase shift a first switch circuitry output signal 0° and a second switch circuitry output signal 45°.

15. The MMW transmitter of claim 13, wherein the second phase shifter is configured to phase shift a first switch circuitry output signal 45° and a second switch circuitry output signal 0°.

16. The MMW transmitter of claim 10, wherein the first phase shifter circuitry is configured to receive in-phase (I) input data and the second phase shifter circuitry is configured to receive quadrature (Q) input data.

17. The MMW transmitter of claim 16, wherein an output signal modulation corresponds to quadrature phase shift keying (QPSK).

18. The MMW transmitter of claim 10, wherein the MMW circuitry comprises a power divided circuitry and two amplifier multiplier chain circuitries, the power divider circuitry configured to provide two divided input signals to the phase modulation circuitry, and each frequency multiplier is a frequency doubler.

* * * * *